US 6,728,930 B2

(12) United States Patent
Poeluev

(10) Patent No.: US 6,728,930 B2
(45) Date of Patent: Apr. 27, 2004

(54) METHOD FOR COMPUTING THE INTERNET CHECKSUM

(75) Inventor: Yuri Poeluev, Mississauga (CA)

(73) Assignee: Cirticom Corp., Mississauga ( * ) Notice: Subject to any disclaimer, the term of this patent is extended or adjusted under 35 U.S.C. 154(b) by 410 days.

(21) Appl. No.: 09/903,989

(22) Filed: Jul. 13, 2001

(65) Prior Publication Data

US 2003/0014706 A1 Jan. 16, 2003

(51) Int. Cl.$^7$ ............................................. H03M 13/00
(52) U.S. Cl. ......................................................... 714/807
(58) Field of Search ................................. 714/801, 807, 714/776; 370/392

(56) References Cited

U.S. PATENT DOCUMENTS 5,247,524 A * 9/1993 Callon ........................ 714/807
5,912,909 A * 6/1999 McCoy ........................ 714/807
6,643,821 B2 * 11/2003 Karim et al. ................ 714/801

OTHER PUBLICATIONS

Scaman et al., FITS Checksum proposal, Aug. 1995, NEC ResearchIndex Citeseer–Citeseer.org, p 1–22.*
Braden R. et al, "Computing the Internet Checksum," Request for Comments: 1071, Sep. 1988, Internet Engineering Task Force. Available at http://www.ietf.org/rfc/rfc1071.txt.
Rijsinghani, A., "Computation of the Internet Checksum via Incremental Update," Request for Comments: 1624, Internet Engineering Task Force. Available at http://www.ietf.org/rfc/rfc1624.txt.
Mallory T. et al, "Incremental Updating of the Internet Checksum," Request for Comments: 1141, Jan. 1990, Internet Engineering Task Force. Available at http://www.ietf.org/rfc/rfc1141.txt.
Bell, C.G. et al, Computer Structures: Readings and Examples, 1971, Chapter 7 Subsection 4: Number Represention, McGraw–Hill, New York, USA. Available at http://www.ulib.org/webRoot/Books/Saving–Bell–Books/Computer–Structures:–Readings–and–Examples/000 00170.htm.

* cited by examiner

*Primary Examiner*—Albert Decady
*Assistant Examiner*—Shelly A Chase
(74) *Attorney, Agent, or Firm*—John R. S. Orange; Santosh K. Chari; Linda Kurdydyk

(57) ABSTRACT

The present invention is directed to a method of updating a checksum associated with a packet of information to be transferred between correspondents. The method comprises the steps of: changing the value of a field; computing a complement; computing a difference; computing a one's complement difference from the first difference; computing a first intermediate checksum value equal to the sum of the complement of the checksum HC and the one's complement difference; computing a one's complement intermediate checksum from the intermediate checksum; computing a complement of the one's complement intermediate checksum; and replacing the checksum in the header with the updated checksum.

4 Claims, 4 Drawing Sheets

| 200 | HC₁ 202 | m 204 | 206 |

| 210 | HC₂ 212 | m 214 | 216 |

⋮

| 2n0 | HCₙ 2n2 | m 2n4 | 2n6 |

| 300 | HC'₁ 302 | m' 304 | 306 |

| 310 | HC'₂ 312 | m' 314 | 316 |

⋮

| 3n0 | HC'ₙ 3n2 | m' 3n4 | 3n6 |

METHOD FOR COMPUTING THE INTERNET CHECKSUM

FIELD OF THE INVENTION

The present invention relates to a method for computing a checksum.

BACKGROUND OF THE INVENTION

When information is transmitted over a network, errors may be introduced. These errors may come from noise on the transmission line or other faults encountered during transmission. In order to detect such errors in information that is transmitted, an error detecting code can be used.

An error detecting code typically consists of a quantity that is computed based on a message, so that the quantity may be recomputed at the destination and the integrity of the transmitted information verified. An error detecting code called the Internet checksum is used by the Internet protocols IP, UDP, and TCP.

The Internet checksum uses a type of arithmetic called one's complement as opposed to two's complement. Two's complement arithmetic is standard binary arithmetic, and is used in many processors. Addition in a two's complement processor is performed by using carries so that, for example in a 4-bit processor, 1111+10 is equal to 0001 with a carry bit set. Negatives are represented by borrowing from a carry bit so that the all ones vector is equal to minus one. By contrast, in one's complement arithmetic, negatives are represented by a logical not of the bits in a number. Accordingly, −1 is represented as 1110. This means that there are two representations for 0, namely 0 and the number of all ones.

The Internet checksum is computed on a packet to be sent to another correspondent. The packet is represented as groups of 8 bits called octets. Octets are paired to form 16 bit integers. The Internet checksum is computed by finding the one's complement sum of these 16 bit integers, and the one's complement of the sum is placed into the checksum field. A checksum may be verified by computing the one's complement sum over all of the octets and the checksum field. A correct checksum will yield the bit string consisting of all ones. When the checksum verification algorithm produces the bit string of all ones, the check succeeds.

Alternatively, the checksum could be recomputed from scratch using the octets in the message and not the checksum field. This recomputed checksum can then be compared to the checksum in the message header.

Some applications must change the information found in the header of a packet sent over the Internet. For example, when using a VPN (virtual private network) a message to the domain name server (DNS) may need to be redirected to a DNS on the VPN. The destination of the packet is indicated by a field in the header. To redirect the packet, an application could change the destination address in the header. In order for this changed message to be accepted, the checksum must also be updated so that the recipient does not reject the message as damaged in transit. In the Internet Request for Comments (RFC) 1071, a method is given for performing incremental updates of the Internet checksum. RFC 1071 shows computing a new sum C' from an original sum C when a message octet m is changed to m'. The formula C' is given as C'=C+(m'−m). However, this method shows how to update a sum rather than the one's complement of the sum, which is the value stored in the header. RFC 1141 points out this difference and teaches the formula ~C'=~C+m+~m', where ~ represents one's complement.

However, it is shown in RFC 1624 that these methods do not work in all situations. There are certain conditions where the checksum computed by the earlier methods will not match the checksum if it were computed from scratch. Accordingly, RFC 1624 teaches another method of computing an incremental checksum. Referring to the header in the checksum as HC, and the new checksum in the header as HC', RFC 1624 provides the formula HC'=HC+m+~m' from RFC 1141 and shows why this does not work in certain situations. RFC 1624 then shows a formula, which does work: HC'=~(~HC+~m+m'), and an alternate formula is also given, namely HC'=HC−~m−m'. Whilst this technique provides an accurate value, it requires repeated operations which accordingly utilises significant resources. This formula requires one's complement arithmetic to implement. It cannot be easily manipulated to allow alternate computation methods in view of the possible incorrect results of earlier formulae.

Constrained environments such as smart cards, pagers, cellular telephones, and personal digital assistants (PDA) have restrictions on memory usage, power consumption, and processor speed. These restrictions may make certain methods unsuitable for implementation on these systems.

The efficiency of the checksum computation affects the efficiency of all operations using the Internet protocols. Accordingly, there is a need for alternate methods of computing an incremental checksum that may be more efficient in certain environments.

It is an object of the present application to obviate or mitigate some of the above disadvantages.

SUMMARY OF THE INVENTION

A method of updating a checksum HC associated with a packet of information to be transferred between correspondents, the packet having a number of fields each having a discrete function, comprises the steps of:

a) changing a value m in one of the fields to a new value m';

b) computing a complement of the checksum HC;

c) computing a first difference of the new value m' and the value m;

d) computing a one's complement difference from the first difference in accordance with an indication provided by the most significant bit of the first difference, the one's complement difference being obtained by decrementing the first difference when the most significant bit indicates a negative first difference, and being equal to the first difference otherwise;

e) computing a first intermediate checksum value equal to the sum of the complement of the checksum HC and the one's complement difference, and setting a carry flag in accordance with the sum;

f) computing a one's complement intermediate checksum from the intermediate checksum in accordance with the carry flag, the one's complement intermediate checksum being obtained by incrementing the first intermediate checksum when the carry flag is set, and being equal to the first intermediate checksum otherwise;

g) computing a complement of the one's complement intermediate checksum to obtain an updated checksum;

h) replacing the checksum in the header with the updated checksum.

In a further embodiment, a method of updating a checksum HC associated with a packet of information to be transferred between correspondents, the packet having a number of fields each having a discrete function, wherein the packet contains a predetermined value m to be changed to a new predetermined value m', comprises the steps of:

a) obtaining a one's complement difference of the new value m' and the value m;

b) computing a complement HC1 of the checksum HC;

c) computing a first intermediate checksum value HC2 equal to the sum of the complement HC1 of the checksum HC and the one's complement difference, and setting a carry flag in accordance with the sum;

d) computing a one's complement intermediate checksum from the intermediate checksum in accordance with the carry flag, the one's complement intermediate checksum being obtained by incrementing the first intermediate checksum when the carry flag is set, and being equal to the first intermediate checksum otherwise;

e) computing a complement of the one's complement intermediate checksum to obtain an updated checksum;

f) replacing the checksum in the header with the updated checksum.

BRIEF DESCRIPTION OF THE DRAWINGS

These and other features of the preferred embodiments of the invention will become more apparent in the following detailed description in which reference is made to the appended drawings wherein.

DESCRIPTION OF THE PREFERRED EMBODIMENTS

Figure 1:
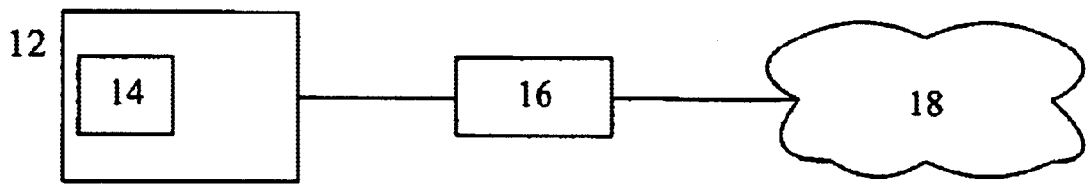
FIG. 1 is a schematic representation of a communication system.

Referring to FIG. 1, a communication system 10 comprises a correspondent 12 such as a cell phone, pager, or PDA, connected to a public network 18 such as the Internet. Typically, the correspondent wishes to connect to a virtual private network (VPN) using the Internet. To connect to a site on the VPN, the correspondent must obtain the IP address of the recipient from a domain name server (DNS). In doing so, the correspondent 12 sends a request for an IP address indicating the destination address as that of the DNS, but after a secure channel has been obtained, the destination address is changed to that of the VPN DNS. This redirects a request originally intended for the DNS to a request to the VPN DNS. The correspondent 12 includes a processor 14 suitable for computing error detecting codes and is connected to the network 18 through a network enabler 16 which processes communications between the correspondent 12 and the network 18 to redirect a transmission as outlined above.

Figure 2:
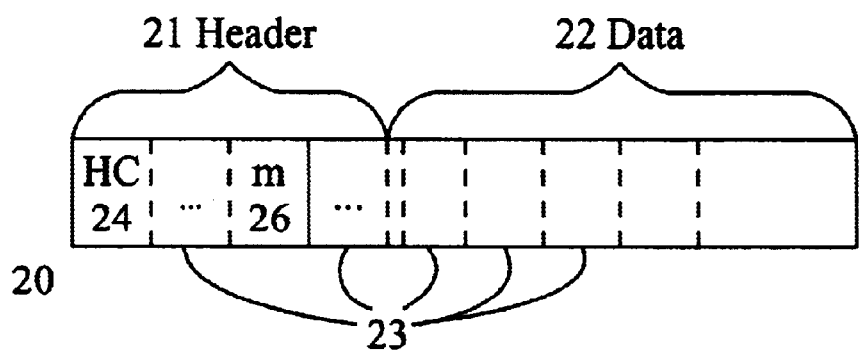
FIG. 2 is a schematic representation of a packet sent through the communication system of FIG. 1.

Communications over the network take the form of packets of a certain length. Each packet 20 comprises a number of fields 23 of a certain length, typically 8 bits for Internet protocols. Referring to FIG. 2, a packet 20 includes a set of fields 23 comprising a header portion 21 and a set of fields 23 comprising a data portion 22, each field comprising an 8 bit segment. The header 21 includes a field 26 containing a value m identifying the intended recipient, and a 16-bit header checksum (HC) 24 computed from the information in the header 21 including the field 26 and the data 22.

Figure 3:
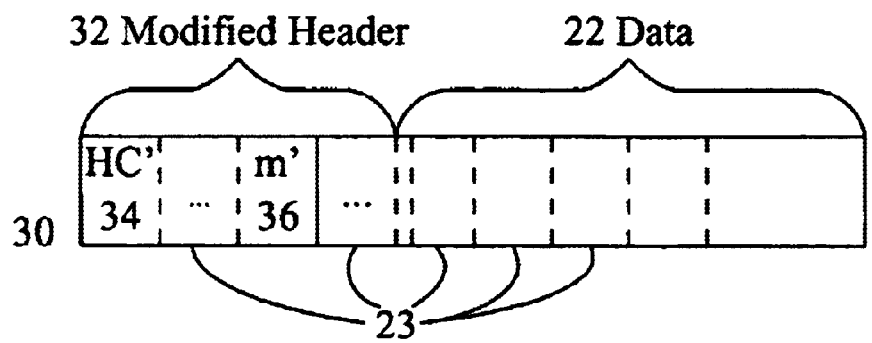
FIG. 3 is a schematic representation of a modified packet, also sent through the communication system of FIG. 1.

The network enabler 16 changes the packet 20 of FIG. 2 into the modified packet 30 of FIG. 3. This modified packet 30 comprises the data 22 from the packet 20 and a modified header 32. The modified header is obtained by replacing the value m in field 26 with the new value m' in the field 36. As a result of this modification, the network enabler 16 also inserts a modified checksum HC' 34 into the packet 30.

Figure 4:
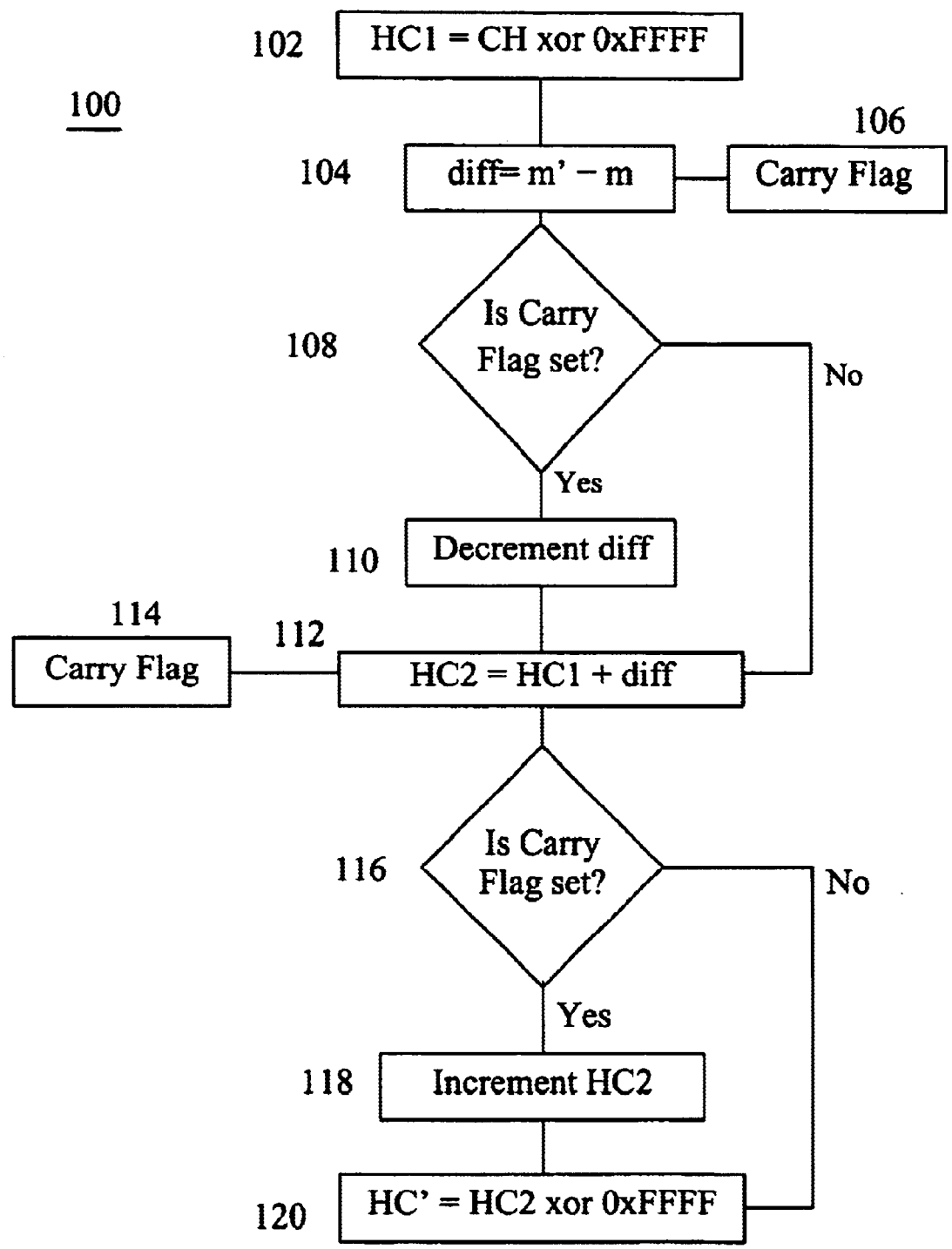
FIG. 4 is a method of updating a checksum in the packet shown in FIG. 2 to form the packet shown in FIG. 3.

Referring to FIG. 4, a method 100 of modifying the 16-bit checksum HC 24 into the modified 16-bit checksum HC' 34 when the value m is changed to the value m' is shown. First, the 16-bit checksum HC is XORed 102 with the 16-bit hexadecimal value 0xFFFF, which is the all ones bit string, to obtain HC1, the one's complement of HC. A difference diff is computed 104 from the new value m' and the old value m by standard two's complement subtraction, which sets a first carry flag 106 if the result is negative. To obtain the one's complement difference of m' and m, the difference diff is decremented by one, as indicated at 110, if the carry flag is set 108, otherwise its value is left unchanged. An intermediate checksum HC2 is then computed 112 from HC1 and diff as HC2=HC1+diff, setting a second carry flag 114 if the two's complement sum overflows 16 bits. To obtain the one's complement intermediate checksum, the intermediate checksum HC2 is then incremented 118 if the second carry flag is set 116, otherwise it is left unchanged. Then the updated checksum HC' is computed by XORing 120 the one's complement intermediate checksum HC2 with 0xFFFF to obtain its one's complement. The updated checksum HC' is then placed in the new packet 30 and the new packet 30 is sent in place of the old packet 20.

Once the enabler 16 has changed the packet and inserted a correct checksum, it simply sends the packet out to the Internet as usual. Assuming there are no errors introduced in transmission, the recipient will check the checksum and accept the new packet as undamaged since the checksum corresponds to the packet contents.

It is recognized that the method may be used when any field in a packet is changed. Typically, fields in the header will be changed, and more usually one specific field will be changed for a particular application. This field may be the destination address as described above in the preferred embodiment, or alternatively any field in the header, or still alternatively any field in a packet. Fields may be changed by a network enabler as described in the preferred embodiment, or by any device that processes the packet. These devices may include for example a driver, an interface, or a router.

Figures 5, 6, 7:
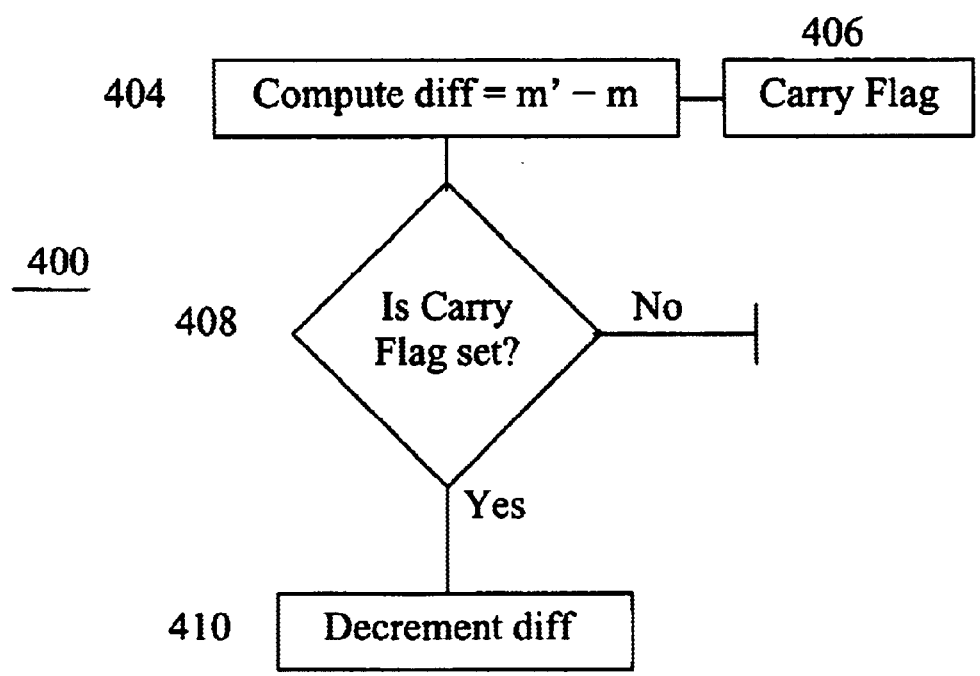
FIG. 5 is a schematic representation of a plurality of packets sent over the communication system shown in FIG. 1.
FIG. 6 is a schematic representation of a plurality of modified packets sent over the communication system shown in FIG. 1.
FIG. 7 is a method of precomputing a difference between a value in the modified packets of FIG. 6 and the packets of FIG. 5.

Referring to FIG. 5, an alternate embodiment for computing incremental checksums is shown. In this embodiment, the value m is changed to the new value m' for each of a plurality of packets 200, 210 . . . 2n0. This could be the situation when the network enabler must redirect packets intended for one fixed address to another fixed address. In that case, the values m and m' are predetermined and pre-computation may be used. Packet 200 comprises a checksum 202 on a header containing the value m in the field 204 and a first set of data 206. A second packet 210 contains the same value m in the field 214, a second set of data 216, with a second checksum 212 computed on the value m in the field 214 and the second set of data 216. Each of the packets are of similar form, with a final packet 2n0 including the same value m in the field 2n4, a final set of data 2n6, and a checksum 2n2 thereupon. The network enabler will process these packets to provide the packets of FIG. 6.

Referring therefore to FIG. 6, packets 300 and 310 through 3n0 correspond to the packets of FIG. 5 after being changed. Each packet contains the data 206, 216, 2n6 from its corresponding packet, the new value m' in the field 304, 314, 3n4 and a corresponding checksum 302, 312, 3n2.

Figure 8:
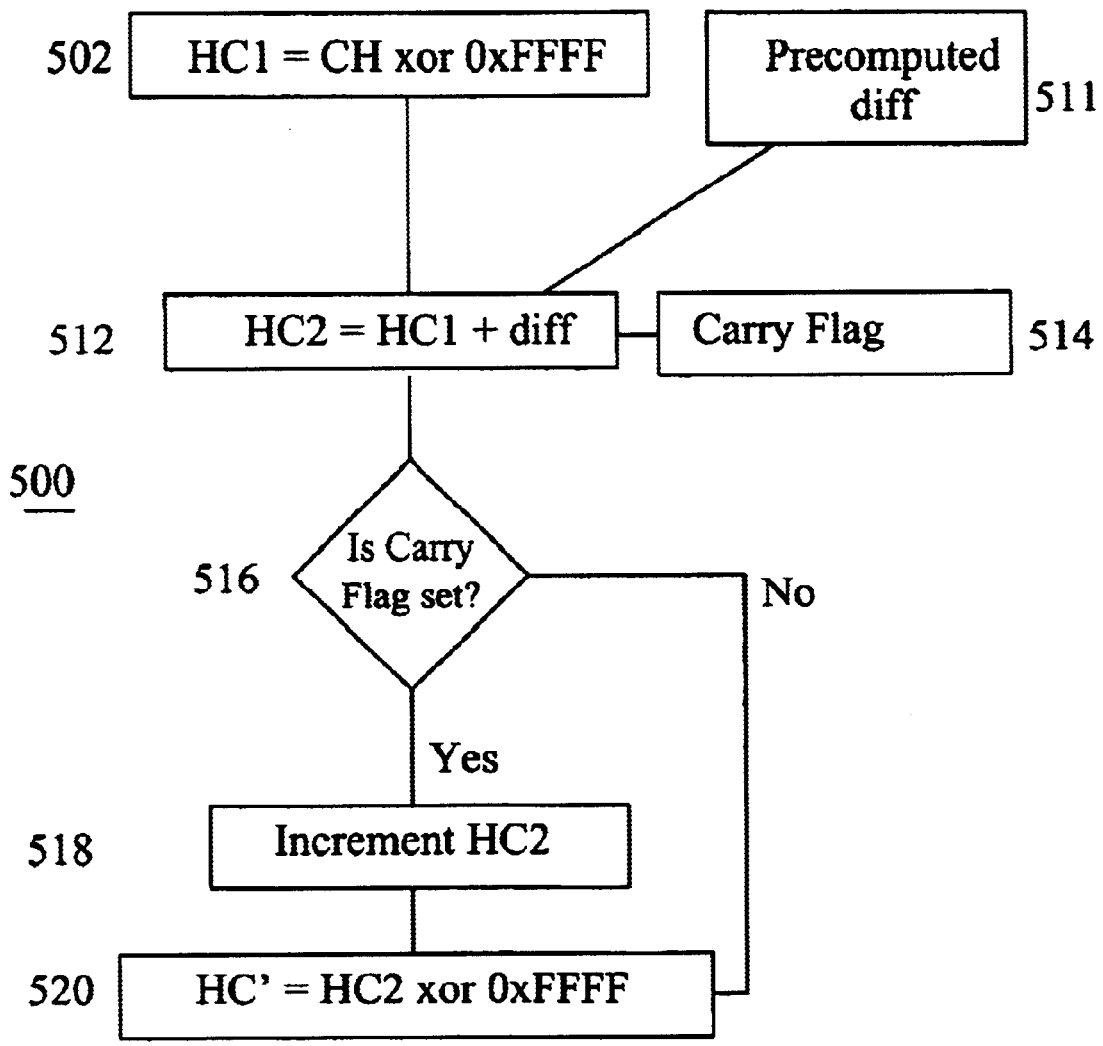
FIG. 8 is a method of updating a checksum in the packets shown in FIG. 6 to form the packets shown in FIG. 7.

The packets of FIG. 6 are obtained from the packets of FIG. 5 by the method of FIGS. 7 and 8. Where the network enabler knows that the value m will be changed to the new value m' it may precompute the change as shown in FIG. 7. First, it computes diff 404 as the integer difference between m' and m, setting a carry flag 406 when the difference is negative. When the carry flag is set 408, the network enabler decrements diff by 1 410, otherwise it leaves diff unchanged. The value of diff is stored for future use in the method of FIG. 8.

Referring therefore to FIG. 8, a packet of the general form of FIG. 5 is modified to a packet of the general form of FIG. 6 by the steps 500. First, the 16-bit checksum HC is XORed 502 with the 16-bit hexadecimal value 0xFFFF, which is the all ones bit string, to obtain HC1, the one's complement of HC. The precomputed value diff is obtained 511 from storage. An intermediate checksum HC2 is then computed 112 from HC1 and diff, as HC2=HC1+diff, setting a second carry flag 514 if the two's complement sum overflows 16 bits. To obtain the one's complement intermediate checksum, the intermediate checksum HC2 is then incremented 518 if the second carry flag is set 516, otherwise it is left unchanged. Then the new checksum HC' is computed by XORing the one's complement intermediate checksum HC2 with 0xFFFF 520 to obtain its one's complement. The new checksum HC' is then placed in the new packet 30 and the new packet 30 is sent in place of the old packet 20.

Accordingly, the Internet checksum may be incrementally updated using the carry flag of the processor to implement addition and subtraction. In the case of subtraction, the carry flag may be indicated by the most significant bit of the difference. Further, a difference may be precomputed when many different packets are changed in the same way.

Each of the above techniques may be used in all of the situations contemplated to provide an accurate, updated checksum without reprocessing of the entire packet.

The embodiments of the invention in which an exclusive property or privilege is claimed are defined as follows:

1. A method of updating a checksum HC associated with a packet of information to be transferred between correspondents, said packet having a number of fields each having a discrete function, said method comprising the steps of:

a) changing a value m in one of said fields to a new value m';

b) computing a complement of said checksum HC;

c) computing a first difference of said new value m' and said value m;

d) computing a one's complement difference from said first difference in accordance with an indication provided by a most significant bit of said first difference, said one's complement difference being obtained by decrementing said first difference when said most significant bit indicates a negative first difference, and being equal to said first difference otherwise;

e) computing a first intermediate checksum value equal to the sum of said complement of said checksum HC and said one's complement difference, and setting a carry flag in accordance with said sum;

f) computing a one's complement intermediate checksum from said first intermediate checksum in accordance with said carry flag, said one's complement intermediate checksum being obtained by incrementing said first intermediate checksum when said carry flag is set, and being equal to said first intermediate checksum otherwise;

g) computing a complement of said one's complement intermediate checksum to obtain an updated checksum;

h) replacing said checksum in said header with said updated checksum.

2. A method according to claim 1 wherein said complements are computed by XORing with 0xFFFF.

3. A method of updating a checksum HC associated with a packet of information to be transferred between correspondents, said packet having a number of fields each having a discrete function, wherein said packet contains a predetermined value m to be changed to a new predetermined value m', said method comprising the steps of:

a) obtaining a one's complement difference of said new value m' and said value m;

b) computing a complement HC1 of said checksum HC;

c) computing a first intermediate checksum value HC2 equal to the sum of said complement HC1 of said checksum HC and said one's complement difference, and setting a carry flag in accordance with said sum;

d) computing a one's complement intermediate checksum from said first intermediate checksum in accordance with said carry flag, said one's complement intermediate checksum being obtained by incrementing said first intermediate checksum when said carry flag is set, and being equal to said first intermediate checksum otherwise;

e) computing a complement of said one's complement intermediate checksum to obtain an updated checksum;

f) replacing said checksum in said header with said updated checksum.

4. A method according to claim 3 wherein said complements are computed by XORing with 0xFFFF.

* * * * *

UNITED STATES PATENT AND TRADEMARK OFFICE
CERTIFICATE OF CORRECTION

PATENT NO. : 6,728,930 B2  Page 1 of 1
DATED : April 27, 2004
INVENTOR(S) : Poeluev, Yuri It is certified that error appears in the above-identified patent and that said Letters Patent is hereby corrected as shown below:

<u>Title page,</u>
Item [73], Assignee, "Cirticom" should read -- Certicom --

Signed and Sealed this

Thirty-first Day of May, 2005

JON W. DUDAS
*Director of the United States Patent and Trademark Office*